(12) United States Patent
Shang et al.

(10) Patent No.: US 12,211,855 B2
(45) Date of Patent: *Jan. 28, 2025

(54) DISPLAY SUBSTRATE AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Tinghua Shang, Beijing (CN); Lulu Yang, Beijing (CN); Zhengwei Luo, Beijing (CN)

(73) Assignees: Chengdu BOFF OptoElectronics Technology Co., Ltd., Chendd (CN); BOE Technology Group Co., Ltd., Beijing (CN)

( * ) Notice: Subject to any disclaimer, the term of this patent is extended or adjusted under 35 U.S.C. 154(b) by 867 days.

This patent is subject to a terminal disclaimer.

(21) Appl. No.: 17/274,861

(22) PCT Filed: Jun. 12, 2020

(86) PCT No.: PCT/CN2020/095936
§ 371 (c)(1),
(2) Date: Mar. 10, 2021

(87) PCT Pub. No.: WO2021/248489
PCT Pub. Date: Dec. 16, 2021

(65) Prior Publication Data
US 2022/0199652 A1 Jun. 23, 2022

(51) Int. Cl.
*H01L 27/12* (2006.01)
*H10K 59/131* (2023.01)

(52) U.S. Cl.
CPC ......... *H01L 27/124* (2013.01); *H10K 59/131* (2023.02)

(58) Field of Classification Search
CPC ............ G02B 27/0179; G02B 27/0172; G02B 27/0101; G02B 27/0093; G02B 27/017;
(Continued)

(56) References Cited

U.S. PATENT DOCUMENTS

| 2002/0030656 A1* | 3/2002 | Goto | G02F 1/133617 |
| | | | 345/89 |
| 2006/0123293 A1* | 6/2006 | Kim | G09G 3/3291 |
| | | | 714/724 |

(Continued)

FOREIGN PATENT DOCUMENTS

| CN | 1811882 A | 8/2006 |
| CN | 1963905 A | 5/2007 |
| CN | 107887420 A | 4/2018 |

*Primary Examiner* — Shaheda A Abdin
(74) *Attorney, Agent, or Firm* — ArentFox Schiff LLP; Michael Fainberg

(57) ABSTRACT

The display substrate includes a substrate, multiple subpixels, multiple data lines, multiple power lines, multiple data signal input lines, multiple selector switches, a first power bus located in a peripheral area and on a side, facing away from the display area, of the multiple selector switches, and multiple power connection cables located in the peripheral area and between the first power bus and the multiple power lines. The multiple power connection cables are electrically connected with the first power bus and the multiple power lines.

17 Claims, 15 Drawing Sheets

(58) Field of Classification Search
CPC ...... G02B 2027/014; G02B 2027/0138; G02B 2027/0187; G06T 19/006; G06F 3/011; G06F 3/012; G06F 2203/012
See application file for complete search history.

(56) References Cited

U.S. PATENT DOCUMENTS

| | | | |
|---|---|---|---|
| 2006/0170625 A1 | 8/2006 | Kim | |
| 2007/0002084 A1* | 1/2007 | Kimura | G09G 3/2085 345/694 |
| 2007/0124633 A1 | 5/2007 | Kim | |
| 2009/0207104 A1 | 8/2009 | Lee | |
| 2014/0085349 A1* | 3/2014 | Shiibayashi | G09G 3/3614 345/690 |
| 2017/0033173 A1 | 2/2017 | Kim | |
| 2020/0027405 A1* | 1/2020 | Lee | G09G 3/3225 |

\* cited by examiner

DISPLAY SUBSTRATE AND DISPLAY DEVICE

CROSS REFERENCE TO RELATED APPLICATIONS

The present disclosure is a US National Stage of International Application No. PCT/CN2020/095936, filed on Jun. 12, 2020, the contents of which are entirely incorporated herein by reference.

FIELD

The present disclosure relates to the field of display, in particular to a display substrate and a display device.

BACKGROUND

With the progress of an intelligent display technology, an organic light emitting diode (OLED) display becomes one of the hotspots in the field of current display researches. More and more active matrix organic light emitting diode (AMOLED) display substrates enter the market. Compared with a traditional thin film transistor liquid crystal display (TFT-LCD), the AMOLED display has faster response and a higher contrast ratio.

SUMMARY

A display substrate provided in embodiments of the present disclosure includes:
- a substrate including a display area and a peripheral area located on at least one side of the display area;
- multiple sub-pixels located in the display area;
- multiple data lines located in the display area and electrically connected with the multiple sub-pixels, wherein the multiple data lines are configured to provide data signals for the multiple sub-pixels;
- multiple power lines located in the display area and electrically connected with the multiple sub-pixels, wherein the multiple power lines are configured to provide power signals for the multiple sub-pixels;
- multiple data signal input lines located in the peripheral area;
- multiple selector switches located in the peripheral area and between the multiple data lines and the multiple data signal input lines, wherein at least one of the multiple selector switches is electrically connected with at least two of the multiple data lines and one of the multiple data signal input lines;
- a first power bus located in the peripheral area and on a side, facing away from the display area, of the multiple selector switches; and
- multiple power connection cables located in the peripheral area and between the first power bus and the multiple power lines; where the multiple power connection cables are electrically connected with the first power bus and the multiple power lines.

Optionally, in embodiments of the present disclosure, an orthographic projection of at least one of the multiple power connection cables on the substrate at least partially overlaps with an orthographic projection of at least one of the selector switches on the substrate.

Optionally, in embodiments of the present disclosure, the multiple power connection cables correspond to the multiple selector switches one by one; and an orthographic projection of each power connection cable on the substrate at least partially overlaps with an orthographic projection of a corresponding selector switch on the substrate.

Optionally, in embodiments of the present disclosure, the at least one of the multiple selector switches includes at least two thin film transistors; the at least two thin film transistors include gates and at least one source and at least two drains located on a side, departing from the substrate, of the gates; and
- an orthographic projection of the each power connection cable on the substrate at least partially overlaps with an orthographic projection of a source or a drain on the substrate.

Optionally, in embodiments of the present disclosure, the orthographic projection of the each power connection cable on the substrate does not overlap with orthographic projections of the gates on the substrate.

Optionally, in embodiments of the present disclosure, each selector switch includes two thin film transistors;
the two thin film transistors include:
- a first active layer located on the substrate;
- a first gate and a second gate located on a side, facing away from the substrate, of the first active layer, where the first gate and the second gate are located on the same layer but do not overlap with each other;
- a first source, a first drain and a second drain located on a side, facing away from the substrate, of the first gate and the second gate, where the first source, the first drain and the second drain are located on the same layer but do not overlap with one another; and the first source is located between the first drain and the second drain;
- the first source is electrically connected with one of the multiple data signal input lines; the first drain and the second drain are electrically connected with two of the multiple data lines;
- the orthographic projection of the each power connection cable on the substrate covers an orthographic projection of the first source on the substrate; and
- the orthographic projection of the each power connection cable on the substrate does not overlap with orthographic projections of the first gate and the second gate on the substrate.

Optionally, in embodiments of the present disclosure, the each power connection cable has a first width in an extension direction perpendicular to the data lines, the first source has a second width in the extension direction perpendicular to the data lines, and the first width is roughly the same as the second width.

Optionally, in embodiments of the present disclosure, orthographic projections of the multiple power connection cables on the substrate are in orthographic projections of gaps among the multiple selector switches on the substrate.

Optionally, in embodiments of the present disclosure, the each power connection cable has a third width in an extension direction perpendicular to the data lines, the each gap has a fourth width in the extension direction perpendicular to the data lines, and the third width is smaller than the fourth width.

Optionally, in embodiments of the present disclosure, the display substrate further includes: a second power bus located between the multiple selector switches and the multiple power lines; the second power bus is electrically connected with the multiple power lines; and the multiple power connection cables are electrically connected with the first power bus and the second power bus.

Optionally, in embodiments of the present disclosure, the display substrate further includes: a third power bus located in the peripheral area;

an orthographic projection of the third power bus on the substrate at least partially overlaps with an orthographic projection of the first power bus on the substrate, and the third power bus is electrically connected with the first power bus.

Optionally, in embodiments of the present disclosure, at least one of the multiple sub-pixels includes a drive thin film transistor, a connection electrode and a storage capacitor;

the drive thin film transistor includes a drive active layer located on the substrate, a drive gate located on a side, facing away from the substrate, of the drive active layer, a gate insulator layer located on a side, facing away from the substrate, of the drive gate, an interlayer dielectric layer located on a side, facing away from the substrate, of the gate insulator layer, and a drive source and a drive drain located on a side, facing away from the substrate away, of the interlayer dielectric layer;

the connection electrode is located on a side, facing away from the substrate, of the drive source and the drive drain;

the storage capacitor includes a first capacitor electrode and a second capacitor electrode; the first capacitor electrode and the drive gate are located on the same layer; the second capacitor electrode is located between the gate insulator layer and the interlayer dielectric layer; and at least one kind of a power connection cable, the first power bus and a data line is located on the same layer as the connection electrode.

Optionally, in embodiments of the present disclosure, at least one kind of a power line, a second power bus and a third power bus is located on the same layer as the drive source and the drive drain; and a data signal input line and the second capacitor electrode are located on the same layer.

Optionally, in embodiments of the present disclosure, the drive active layer and the first active layer are located on the same layer;

the first gate, the second gate and the drive gate are located on the same layer; and the first source, the first drain and the second drain are located on the same layer as the drive source and the drive drain.

Optionally, in embodiments of the present disclosure, an orthographic projection of the first power bus on the substrate at least partially overlaps with orthographic projections of the multiple data signal input lines on the substrate.

Optionally, in embodiments of the present disclosure, the first power bus includes multiple openings formed at intervals; and orthographic projections of the multiple openings on the substrate partially overlap with the orthographic projections of the multiple data signal input lines on the substrate.

Optionally, in embodiments of the present disclosure, the multiple openings are divided into multiple opening groups arranged along a second direction; each opening group includes multiple openings arranged along a first direction; the first direction intersects with the second direction; and openings in at least two adjacent opening groups are staggered.

Optionally, in embodiments of the present disclosure, the multiple data signal input lines include first data signal input lines and second data signal input lines;

the first data signal input lines and the second data signal input lines are alternatively arranged along a first direction;

the first data signal input lines and drive gates are located on the same layer; and the second data signal input lines and second capacitor electrodes are located on the same layer.

Optionally, in embodiments of the present disclosure, the at least one of the multiple sub-pixels further includes: a light emitting diode located on a side, facing away from the substrate, of the connection electrode; and the drive drain, the connection electrode and the light emitting diode are electrically connected in sequence.

A display device provided in embodiments of the present disclosure, including the display substrate.

DETAILED DESCRIPTION OF THE EMBODIMENTS

To make the objectives, technical solutions and advantages of embodiments of the present disclosure clearer, a clear and complete description of the technical solutions in the present disclosure will be given below, in combination with the accompanying drawings in the embodiments of the present disclosure. Apparently, the embodiments described herein are one part of embodiments in the present disclosure, rather than all of the embodiments. Moreover, embodiments in the present disclosure and features in the embodiments may be combined mutually under the condition of no conflicts. Based on the described embodiments of the present disclosure, all other embodiments available to those of ordinary skill in the art without creative labor shall belong to the protection scope of the present disclosure.

Unless otherwise defined, technical or scientific terms used in the present disclosure shall be in the common sense understood by those of ordinary skill in the field to which the present disclosure belongs. "First", "second" and similar words mentioned in the present disclosure do not represent any sequence, number or importance but only distinguish different parts. Words like "include" or "comprise" imply that elements or things preceding the words cover elements or things listed after the words and its equivalent, without excluding other elements or things. Similar words such as "connect" or "connected" are not limited to physical or mechanical connection, but may include electric connection, whether direct or indirect.

It should be noted that, dimensions and shapes of figures in drawings do not reflect true proportions and are only intended to indicate the content of the present disclosure. And consistently same or similar numerals denote same or similar components or components with same or similar functions.

Figure 1A:
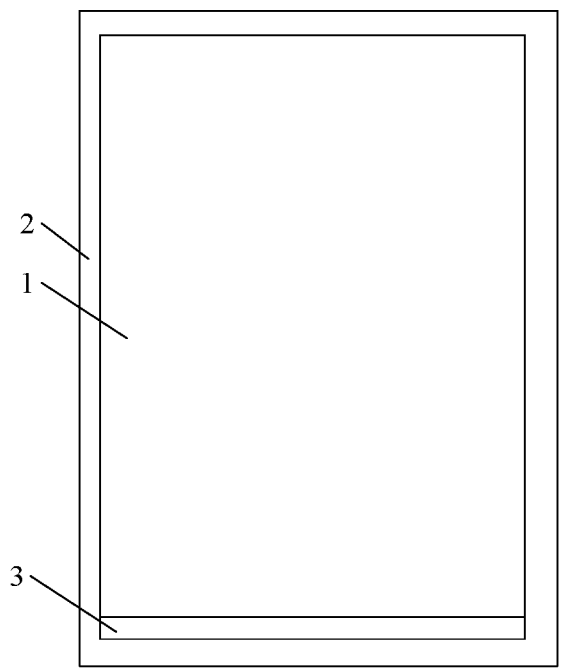
FIG. 1a is a structural schematic diagram of some display substrates in related technologies.
Figure 1B:
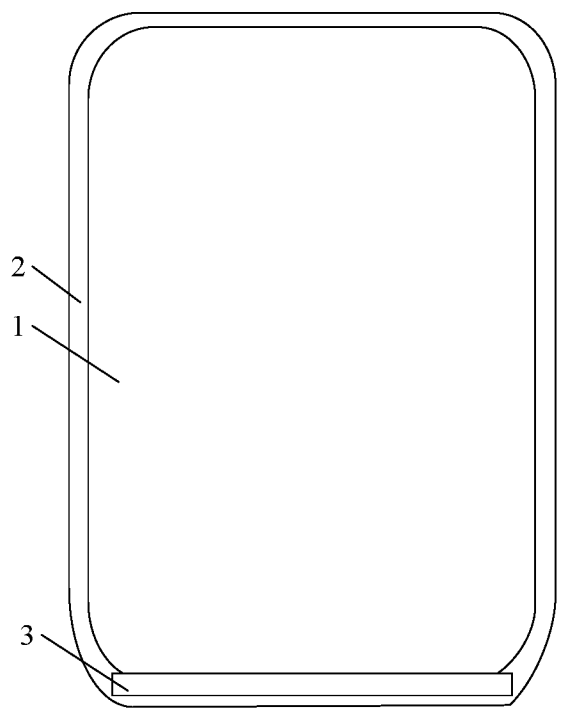
FIG. 1b is a structural schematic diagram of some display substrates in related technologies.

Generally speaking, as shown in FIG. 1a and FIG. 1b, a display substrate includes a display area 1 and a peripheral area 2 around the display area 1; a pixel array is arranged in the display area 1; and a circuit pattern is arranged in the peripheral area 2. The pixel array includes multiple sub-pixels and signal lines used for the sub-pixels, the signal lines for example include gate lines, data lines, power lines and the like, generally one gate line is arranged corresponding to each row of sub-pixels, and one or two data lines are arranged for each row of sub-pixels. The circuit pattern for providing corresponding signals for the gate lines and the data lines is arranged in the peripheral area 2, for example, a Gate Driver on Array (GOA) circuit and the like for providing signals for the gate lines.

For example, the circuit pattern may be arranged in a lower frame area 3 in the peripheral area. For example, a narrow frame may be achieved by simplified design for the circuit pattern arranged in the lower frame area 3, to further increase a screen-to-body ratio.

For example, circuit layout may be simplified by a Multiplexing (MUX) technology. According to the multiplexing technology, multiple data lines (for example, two data lines) in the peripheral area is connected with one selector switch, at different periods of time, electric signals are transmitted to different data lines through the selector switches, then the number of wiring in the peripheral area is reduced, and the space occupied by circuits is reduced.

For example, in the display substrate, two data lines may be enabled to be connected with one selector switch, so as to enable the two data lines to share one same signal channel, that is, a setup mode of MUX 1:2 (namely an either-or selector circuit) is adopted, therefore, the number of wiring in the peripheral area 2 is reduced by a half, then the occupation space of wiring is reduced, and the purpose of reducing the frame is ultimately achieved.

In some cases, while achieving the narrow frame, in order to further improve the display effect of the display area and the overall attractiveness of the display substrate, the frame of the display substrate and corners of the display area may be round corners, but such design may affect circuit setup in the peripheral area.

Figure 2:
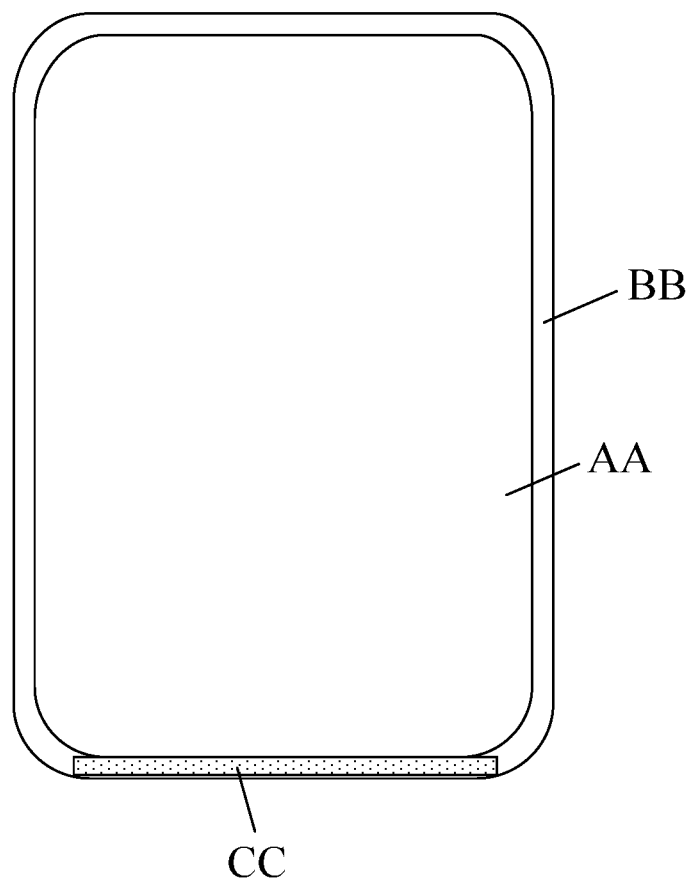
FIG. 2 is a structural schematic diagram of other display substrates in related technologies.

At least one embodiment of the present disclosure provides a display substrate. FIG. 2 is a planar schematic diagram of the display substrates in the embodiment of the present disclosure.

Figure 3:
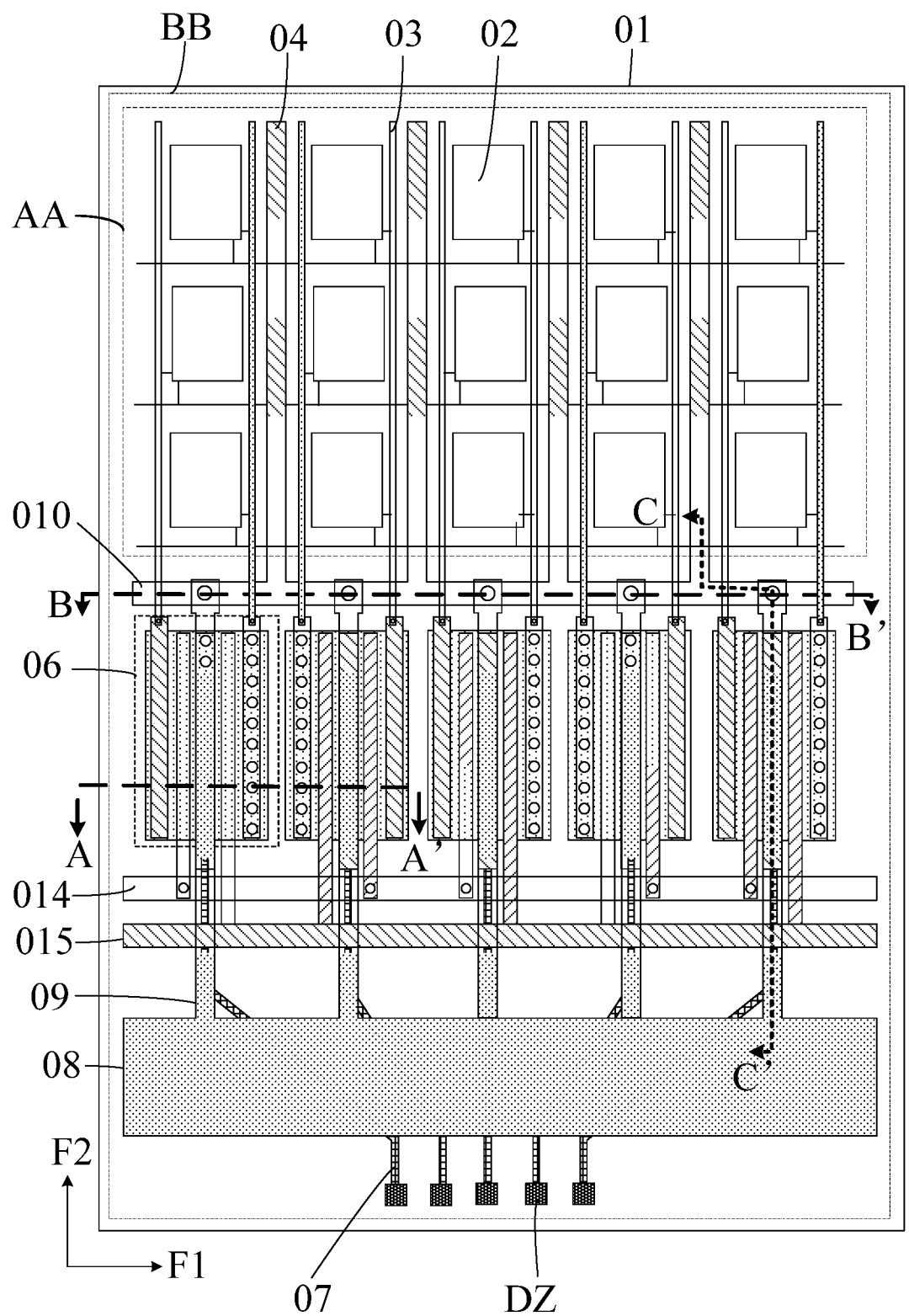
FIG. 3 is a structural schematic diagram of some display substrates in embodiments of the present disclosure.
Figure 4A:
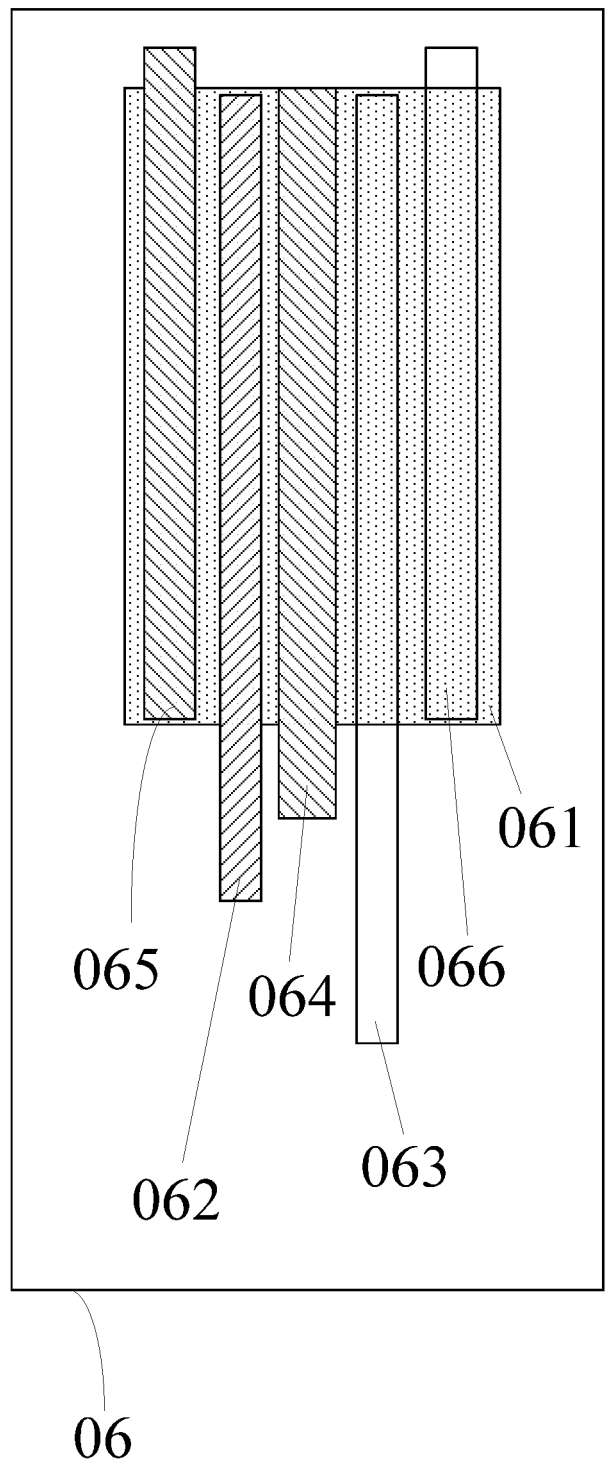
FIG. 4a is a structural schematic diagram of some selector switches in some display substrates in embodiments of the present disclosure.
Figure 4B:
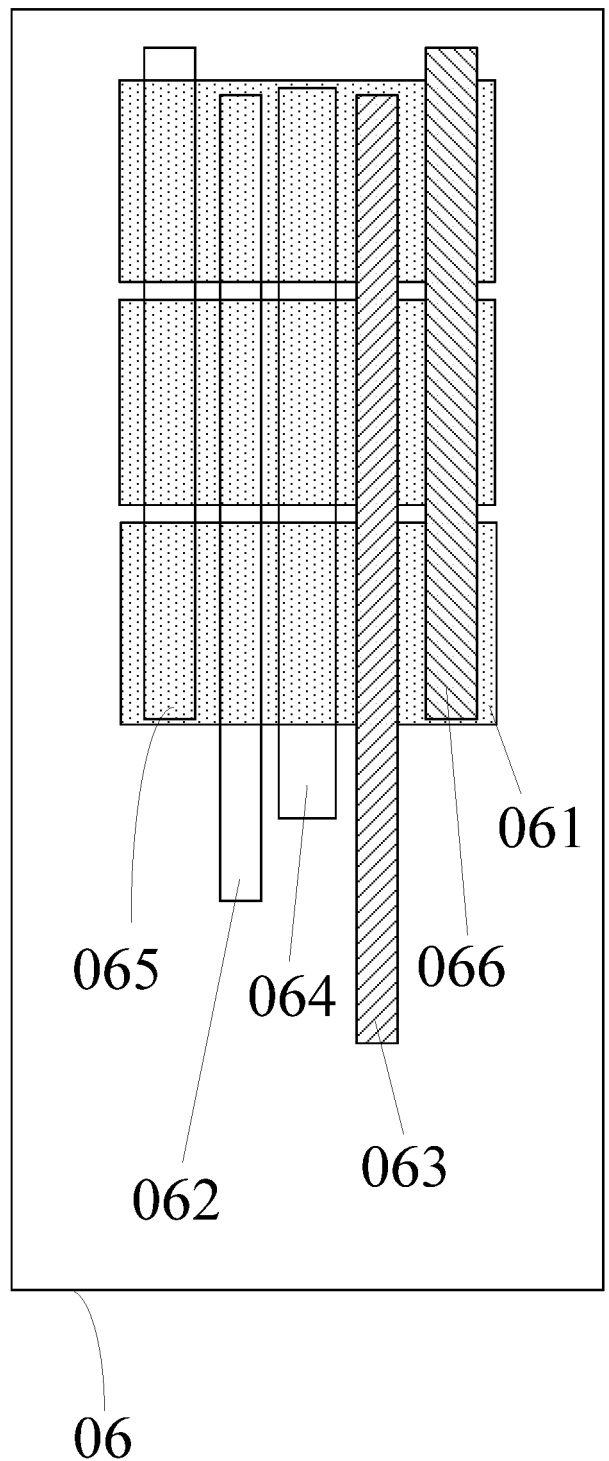
FIG. 4b is a structural schematic diagram of other selector switches in some display substrates in embodiments of the present disclosure.
Figure 5A:
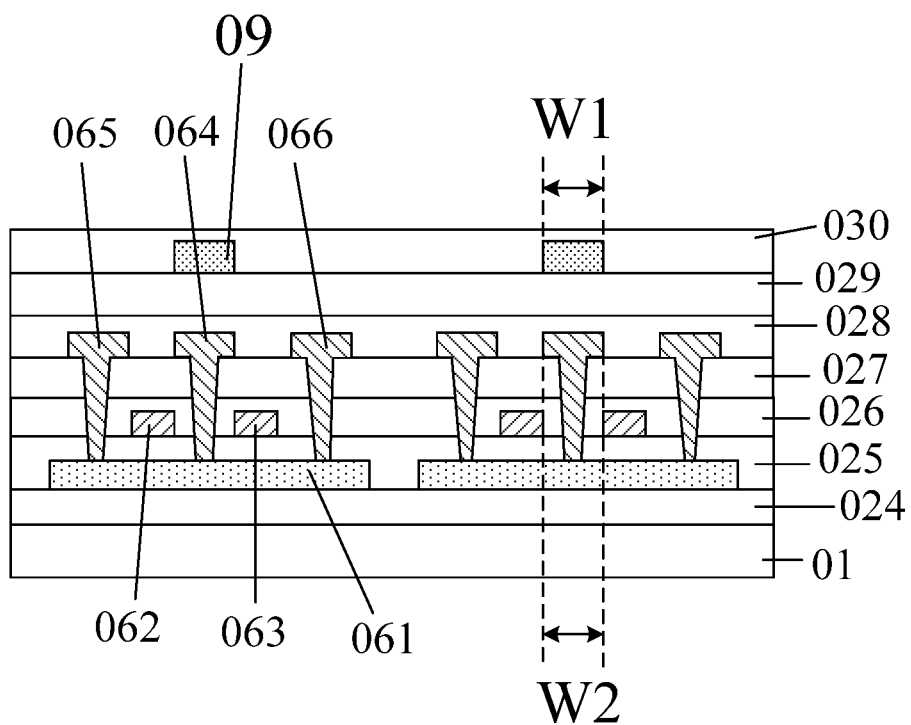
FIG. 5a is a section view structural schematic diagram of a display substrate shown in FIG. 3 along a direction AA'.
Figure 5B:
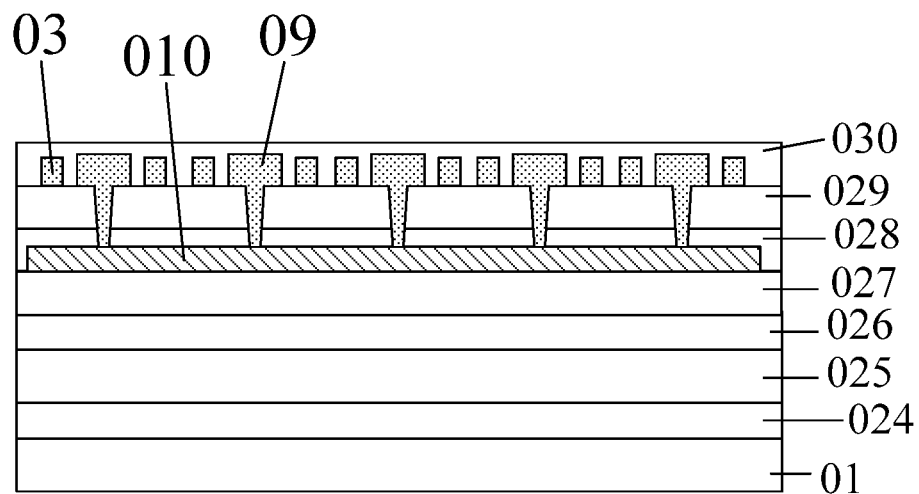
FIG. 5b is a section view structural schematic diagram of the display substrate shown in FIG. 3 along a direction BB'.
Figure 5C:
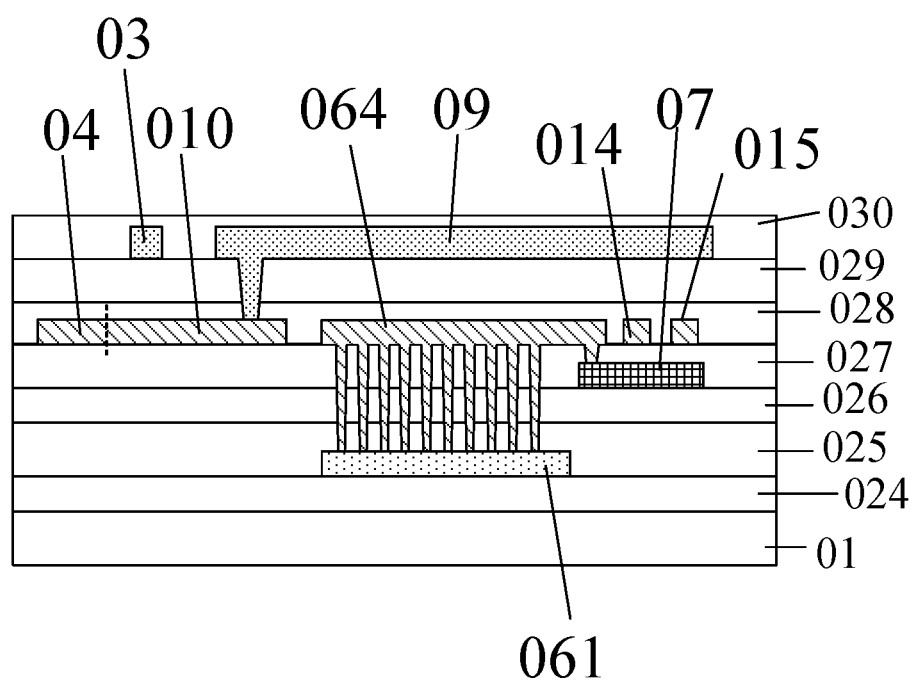
FIG. 5c is a section view structural schematic diagram of the display substrate shown in FIG. 3 along a direction CC'.
Figure 5D:
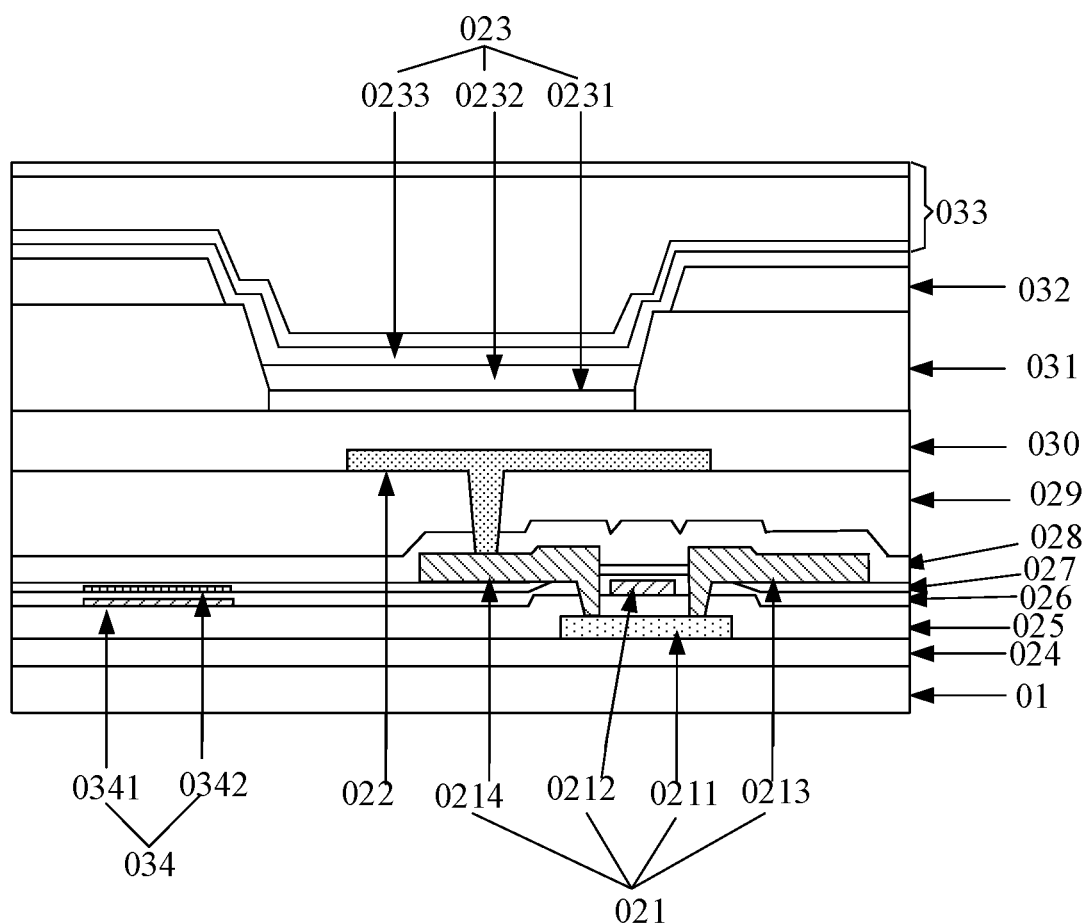
FIG. 5d is a section view structural schematic diagram of sub-pixels in embodiments of the present disclosure.

FIG. 3 is a planar schematic diagram of a specific structure in the display substrates in the embodiment of the present disclosure; FIG. 4a is some structural schematic diagrams of selector switches 06; FIG. 4b is other structural schematic diagrams of selector switches 06; FIG. 5a is a structural schematic diagram of a section view of the display substrate shown in FIG. 3 along a direction AA'; FIG. 5b is a structural schematic diagram of a section view of the display substrate shown in FIG. 3 along a direction BB'; and FIG. 5c is a structural schematic diagram of a section view of the display substrate shown in FIG. 3 along a direction CC'. FIG. 5d is a structural schematic diagram of a section view of a sub-pixel.

As shown in FIG. 3-FIG. 5c, the display substrate provided in embodiments of the present disclosure may include:
- a substrate 01, where the substrate 01 includes a display area AA and a peripheral area BB located on at least one side of the display area AA; the embodiments are introduced by taking that the peripheral area BB is located around the display area AA as an example;
- multiple sub-pixels 02 located in the display area AA, where the multiple sub-pixels 02 may emit light to achieve a display function;
- multiple data lines 03 located in the display area AA and electrically connected with the multiple sub-pixels 02, where the multiple data lines 03 are configured to provide data signals for the multiple sub-pixels 02;
- multiple power lines 04 located in the display area AA and electrically connected with the multiple sub-pixels 02, where the multiple power lines 04 are configured to provide power signals for the multiple sub-pixels 02;
- multiple data signal input lines 07 located in the peripheral area BB;
- multiple selector switches 06 located in the peripheral area BB, arranged at intervals and located between the multiple data lines 03 and the multiple data signal input lines 07, where at least one of the multiple selector switches 06 is electrically connected with at least two of the multiple data lines 03 and one of the multiple data signal input lines 07; the multiple selector switches 06 may selectively transmit data signals to the multiple data lines 03; the embodiments are introduced by taking that each selector switch 06 is connected with two data lines 03 as an example; in addition, the multiple data signal input lines 07 are located on a side, facing away from the display area AA, of the multiple selector switches 06; at least one of the multiple selector switches 06 is electrically connected with one of the multiple data signal input lines 07; the embodiments are introduced by taking that each selector switch 06 is connected with one data signal input line as an example;
- a first power bus 08 located in the peripheral area BB and on a side, facing away from the display area AA, of the multiple selector switches 06; and
- multiple power connection cables 09 located in the peripheral area BB and between the first power bus 08 and the multiple power lines 04, where the multiple power connection cables 09 are electrically connected with the first power bus 08 and the multiple power lines 04.

Exemplarily, the first power bus 08 may be connected with the sub-pixels 02 in the display area AA through the multiple power connection cables 09 and the multiple power lines 04 to achieve power supply to the sub-pixels 02.

Exemplarily, as shown in FIG. 2, the multiple power connection cables 09 are located in a lower frame CC in the peripheral area BB.

Exemplarily, as shown in FIG. 3, the multiple power connection cables 09 extend along a row direction F2 of the sub-pixels. In addition, in an extension direction of an edge of the display area AA adjacent to the multiple power connection cables 09, that is, in a direction F1 in the figure, the multiple selector switches 06 are arranged at intervals, and the multiple power connection cables 09 are also arranged at intervals.

In specific application, in embodiments of the present disclosure, as shown in FIG. 3, an orthographic projection of at least one of the multiple power connection cables on the substrate at least partially overlaps with an orthographic projection of at least one of the multiple selector switches on the substrate. Therefore, the occupation space of the power connection cables may be reduced. Consequently, the occupation space of the lower frame CC of the peripheral area BB is reduced, and furthermore the narrow frame is achieved.

According to the display substrate provided by the embodiments of the present disclosure, by designing the circuit pattern in the peripheral area, for example, by designing the circuit pattern in the lower frame CC of the peripheral area BB, the occupation space of the lower frame CC of the peripheral area BB may be reduced, and furthermore designing of the narrow frame is achieved.

In specific application, in embodiments of the present disclosure, as shown in FIG. 3 to FIG. 5c, the multiple power connection cables may correspond to the multiple selector switches one by one, that is, one power connection cable 09 corresponds to one selector switch 06. Then the orthographic projection of each of the multiple power connection cables on the substrate at least partially overlaps with the orthographic projection of a corresponding selector switch on the substrate. Therefore, the occupation space of the power connection cables may be reduced. Consequently, the occupation space of the lower frame CC of the peripheral area BB is reduced, and furthermore the narrow frame is achieved. In addition, multiple power connection cables 09 may also be arranged in this way, so that transmission stability of power signals is facilitated.

In specific application, in embodiments of the present disclosure, as shown in FIG. 3 to FIG. 5c, at least one of the multiple selector switches includes at least two thin film transistors; the at least two thin film transistors include gates and at least one source and at least two drains located on a side, departing from the substrate, of the gates. Exemplarily, as shown in FIG. 3, each of the multiple selector switches includes two thin film transistors; or each of the multiple selector switches includes three thin film transistors; or each of the multiple selector switches includes six thin film transistors, which is not defined here.

In specific application, in embodiments of the present disclosure, the orthographic projection of each of the multiple power connection cables on the substrate at least partially overlaps with the orthographic projection of a source or a drain on the substrate. For example, as shown in FIG. 3 to FIG. 5c, the orthographic projection of the power connection cable 09 on the substrate 01 at least partially overlaps with the orthographic projection of one source (such as 064) on the substrate 01.

In specific application, in embodiments of the present disclosure, as shown in FIG. 3 to FIG. 5c, the orthographic projection of each of the multiple power connection cables 09 on the substrate 01 does not overlap with orthographic projections of the gates (such as 062 and 063) on the substrate 01. Under normal conditions, when the gate of the thin film transistor is loaded with an on signal, the thin film transistor may be controlled to be turned on to enable the source and the drain of the thin film transistor to form signal communication routes. In embodiments of the present disclosure, the orthographic projection of each power connection cable on the substrate does not overlap with the orthographic projections of the gates on the substrate. In this way, the power connection cables and the gates of the thin film transistors may be prevented from forming parasitic capacitance, and adverse influence of the power connection cables upon on and off of the thin film transistors is avoided.

In specific application, in embodiments of the present disclosure, as shown in FIG. 3 to FIG. 5c, the selector switches 06 include two thin film transistors, that is, the selector switch 06 including two thin film transistors includes:

a first active layer 061 located on the substrate 01;

a first gate 062 and a second gate 063 located on a side, facing away from the substrate 01, of the first active layer 061, where the first gate 062 and the second gate 063 are located on the same layer but do not overlap with each other;

a first source 064, a first drain 065 and a second drain 066 located on a side, facing away from the substrate 01, of the first gate 062 and the second gate 063, where the first source 064, the first drain 065 and the second drain 066 are located on the same layer but do not overlap with one another; the first source 064 is located between the first drain 065 and the second drain 066;

the first source 064 is electrically connected with one of the multiple data signal input lines 07; and the first drain 065 and the second drain 066 are electrically connected with two of the multiple data lines 03.

Exemplarily, as shown in FIG. 4a, the first active layer 061 may be of an integral structure. Or as shown in FIG. 4b, the first active layer 061 may also be divided into separated parts to improve a heat radiation effect.

Optionally, an orthographic projection of each of the first gate 062 and the second gate 063 on the substrate 01 does not overlap with orthographic projections of the first source 064, the first drain 065 and the second drain 066 on the substrate 01. For example, the orthographic projection of the first gate 062 on the substrate 01 is located between the orthographic projections of the first drain 065 and the first source 064 on the substrate 01. The orthographic projection of the second gate 063 on the substrate 01 is located between the orthographic projections of the first source 064 and the second drain 066 on the substrate 01.

In specific application, in embodiments of the present disclosure, as shown in FIG. 3 to FIG. 5c, the orthographic projection of each power connection cable 09 on the substrate 01 covers the orthographic projection of the first source 064 on the substrate 01. In addition, the orthographic projection of each power connection cable 09 on the substrate 01 does not overlap with the orthographic projections of the first gate 062 and the second gate 063 on the substrate. Since the first source is for inputting signals, it has small influence upon on and off of a thin film transistor, therefore, on the basis of reducing an occupation area, influence of the power connection cables upon on and off of the thin film transistors may also be reduced.

In specific application, in embodiments of the present disclosure, as shown in FIG. 3 and FIG. 5a, aiming at each power connection cable 09 and the first source 064 of which the orthographic projections overlap with each other, each power connection cable 09 has a first width W1 in a direction F1, the first source 064 has a second width W2 in the direction F1, and the first width W1 is roughly the same as the second width W2. In this way, the width of the power connection cable may be designed according to the first source, so that the designing difficulty of the power connection cable is reduced. Definitely, the first width may also be smaller than the second width, which is not defined here.

In specific application, in embodiments of the present disclosure, as shown in FIG. 3 and FIG. 5b, the display substrate further includes a second power bus 010 located between the multiple selector switches 06 and the multiple power lines 04. The second power bus 010 is electrically connected with the multiple power lines 04. In addition, the multiple power connection cables 09 are electrically connected with the first power bus 08 and the second power bus 010. Therefore, the first power bus 08 may provide the power signals for the multiple power lines 04 through the multiple power connection cables 09 and the second power bus 010.

Exemplarily, an orthographic projection of the second power bus 010 on the substrate does not overlap with the orthographic projections of the multiple selector switches 06 on the substrate 01. The second power bus 010 may be located in the peripheral area. For example, the second power bus 010 is located between the multiple selector switches 06 and the display area AA, or the second power bus 010 may also be located in the display area AA.

Figure 6A:
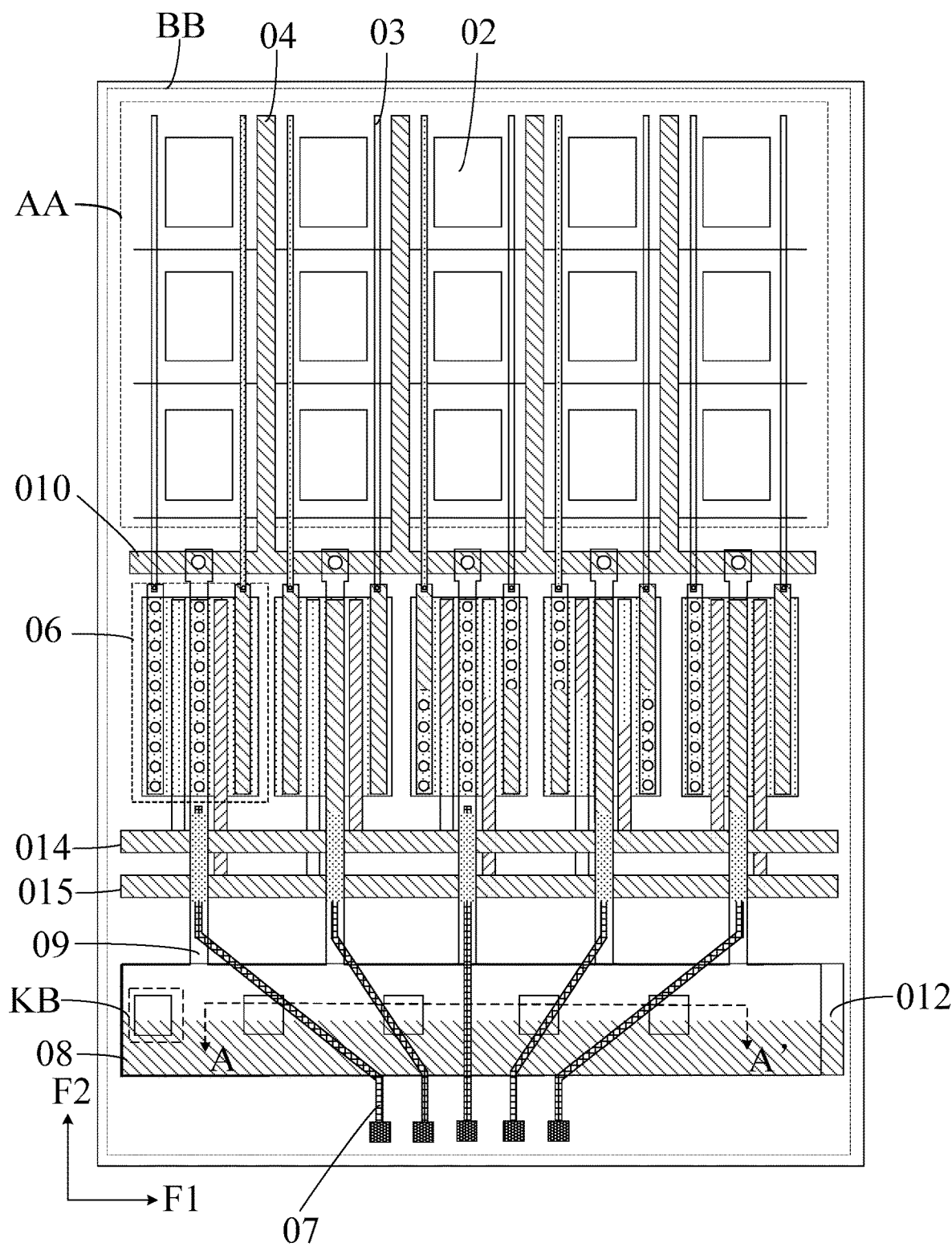
FIG. 6a is a structural schematic diagram of other display substrates in embodiments of the present disclosure.
Figure 6B:
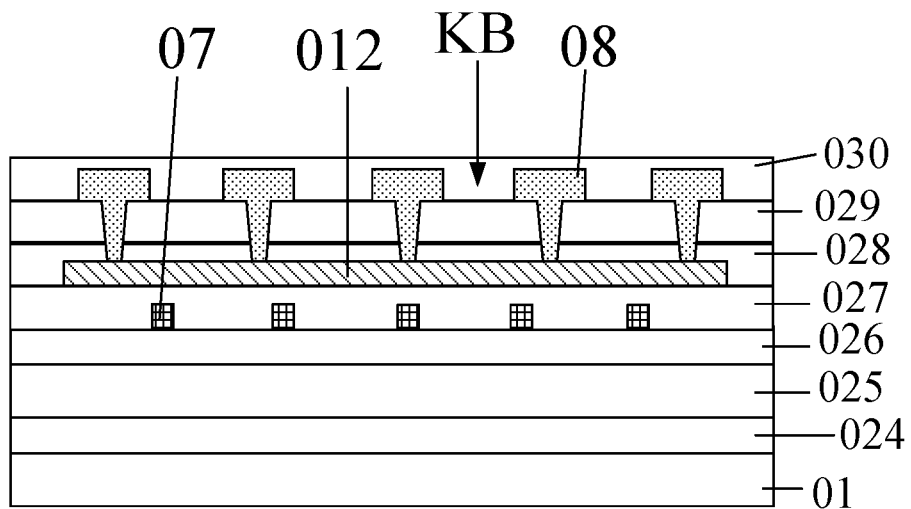
FIG. 6b is a section view structural schematic diagram of a display substrate shown in FIG. 6a along a direction AA'.

In specific application, in embodiments of the present disclosure, as shown in FIG. 6a and FIG. 6b, the display substrate further includes a third power bus 012 located in the peripheral area; the orthographic projection of the third power bus 012 on the substrate 01 at least partially overlaps with the orthographic projection of the first power bus 08 on the substrate 01; and the third power bus 012 is electrically connected with the first power bus 08 via a through hole. Therefore, on the basis of multi-layer wiring designing, under the same width, parallel connection of power buses may reduce resistance of the power buses, so that voltage drop of the first power bus 08 may be reduced to ensure long-term uniformity of the display substrate.

In specific application, in embodiments of the present disclosure, as shown in FIG. 3, the orthographic projection of the first power bus 08 on the substrate 01 at least partially overlaps with the orthographic projections of the data signal input lines 07 on the substrate 01. For example, the orthographic projection of the first power bus 08 on the substrate 01 at least partially overlaps with the orthographic projections of the data signal input lines 07 on the substrate 01.

In specific application, in embodiments of the present disclosure, as shown in FIG. 3 and FIG. 6a, a signal source end (for example, multiple signal input pads DZ in FIG. 3) of the display substrate may input data signals to the multiple selector switches 06 through multiple data signal input lines 07 respectively. When the signal source end inputs the data signals to a selector switch 06 through each data signal input line 07, the data signals are input to the first source 064 of the selector switch. With cooperation with control signals provided by a first control line 014 and a second control line 015, the data signals on the first source 064 may be respectively transmitted to two data lines 03 at different periods of time. For example, an on signal may be firstly input to the first control line 014 to turn on the first source 064 and the first drain 065, and at the moment, the data signals on the first source 064 are transmitted to one data line 03 via the first drain 064; and secondly, the on signal is input into the second control line 015 to turn on the first source 064 and the second drain 066, and at the moment, the data signals on the first source 064 are transmitted to the other data line 03 via the second drain 066. After the data signals are input to each data line 03, the sub-pixels connected with each data line 03 also receive the data signals. For example, after each sub-pixel 02 receives the power signals to claim 1 any one of through cooperation with other electric signals, the purpose of displaying images on the display substrate may be achieved.

In specific application, in embodiments of the present disclosure, as shown in FIG. 3 and FIG. 6a, at least one of the multiple sub-pixels 02 (such as, each sub-pixel 02) may include a pixel drive circuit and a light emitting diode. The pixel drive circuit has a transistor and a capacitor, and generates an electric signal under the interaction of the transistor and the capacitor. The generated electric signal is input to a first electrode of the light emitting diode. In addition, a second electrode of the light emitting diode is loaded with a corresponding voltage to drive the light emitting diode to emit light.

Exemplarily, a 7T1C pixel circuit may be adopted as the pixel drive circuit, and a 2T1C pixel circuit may also be adopted as the pixel drive circuit, which is not defined here.

In specific application, in embodiments of the present disclosure, as shown in FIG. 3 to FIG. 5d, the pixel drive circuit may include a drive thin film transistor 021 and a connection electrode 022 (introduced only by taking the drive thin film transistor 021 and the connection electrode 022 as examples). The drive thin film transistor 021 includes a drive active layer 0211 located on the substrate 01, a drive gate 0212 located on a side, facing away from the substrate 01, of the drive active layer 0211, and a drive source 0213 and a drive drain 0214 located on a side, facing away from the substrate 01, of the drive gate 0212. The connection electrode 022 is located on a side, away from the substrate 01, of the drive source 0213 and the drive drain 0214. In addition, the light emitting diode 023 (including a first electrode 0231, a light emitting layer 0232 and a second electrode 0233 which are arranged in sequence along a direction away from the substrate 01) is located on a side, facing away from the substrate 01, of the connection electrode 022; and the drive drain 0214, the connection electrode 022 and the light emitting diode 023 are connected in sequence. When a voltage is applied between the first electrode 0231 and the second electrode 0233, the light emitting layer 0232 may emit light. For example, the first electrode 0231 of the light emitting diode 023 is electrically connected with the drive drain 0214 through the connection electrode 022, so that the drive thin film transistor may control light emitting states of the light emitting diode 023.

Exemplarily, materials of the drive gate 0212 and the drive drain 0214 may be a conductive material. For example, materials of a conductive layer may include metallic materials such as aluminum, molybdenum and titanium, or alloy materials and the like, may also include a metallic oxide, such as, materials of indium tin oxide (ITO) and the like, and embodiments of the present disclosure do not define materials of different functional layers.

In specific application, in embodiments of the present disclosure, as shown in FIG. 3 and FIG. 5d, each sub-pixel 02 may further include: a buffer layer 024, a first gate insulator layer 025, a second gate insulator layer 026, an interlayer dielectric layer 027, a passivation layer 028, a first flat layer 029, a second flat layer 030, a pixel defining layer 031, a support layer 032 and a packaging layer 033 which are arranged in sequence along a direction away from the substrate 01. The drive active layer 0211 is located between the buffer layer 024 and the first gate insulator layer 025; the drive gate 0212 is located between the first gate insulator layer 025 and the second gate insulator layer 026; the drive source 0213 and the drive drain 0214 are located between the interlayer dielectric layer 027 and the passivation layer 028; and the connection electrode 022 is located between the first flat layer 029 and the second flat layer 030. The pixel defining layer 031 is configured to define a pixel area on the substrate 01, and the above light emitting diode 023 is located in the pixel area.

For example, the pixel defining layer 031 includes multiple openings respectively corresponding to the multiple sub-pixels 02, and the light emitting diodes 023 are respectively formed in the multiple openings. For example, the packaging layer 033 may include multiple packaging sub-layers, such as, three packaging sub-layers illustrated in the figures. For example, the three packaging sub-layers include a first inorganic packaging sub-layer, an organic packaging sub-layer and a second inorganic packaging sub-layer which are overlapped, to enhance the packaging effect of the packaging layer 033.

For example, the gate insulator layer (including a first gate insulator layer 025 and a second gate insulator layer 026), the interlayer dielectric layer 027, the buffer layer 024, the flat layer 028, the pixel defining layer 031, the support layer 032, the packaging layer 033 and the like are all formed by insulating materials. According to demands, organic insulating materials may be selected, such as, materials of polyimide, resin materials and the like; inorganic insulating materials may also be selected, such as, materials of silicon oxide, silicon nitride, silicon oxynitride and the like; and embodiments of the present disclosure do not specifically define materials of different function layers.

It needs to be stated that the buffer layer 024, the first gate insulator layer 025, the second gate insulator layer 026, the interlayer dielectric layer 027, the passivation layer 028, the first flat layer 029 and the second flat layer 030 in the display area AA may all extend to the peripheral area BB, in addition, the relative position relationship of the membrane layers in the peripheral area BB is the same as that in the display area AA, and it is not repeatedly described in the embodiments of the present disclosure any longer.

It needs to be stated that as shown in FIG. 5c, a power line 04 and the second power bus 010 are directly electrically connected. In addition, the first source 064 is electrically connected with the first active layer 061 via multiple through holes passing through the first gate insulator layer 025, the second gate insulator layer 026 and the interlayer dielectric layer 027. In addition, the first source 064 is electrically connected with the data signal input layer 07 via a through hole passing through the interlayer dielectric layer 027.

In addition, as shown in FIG. 3 and FIG. 5d, each sub-pixel 02 may also include a storage capacitor 034; the storage capacitor 034 includes a first capacitor electrode 0341 and a second capacitor electrode 0342; the first capacitor electrode 0341 and the drive gate 0212 are located on the same layer; and the second capacitor electrode 0342 is located between the gate insulator layer 026 and the interlayer dielectric layer 027.

Exemplarily, a part of the structure of the display area AA in the display substrate may be on the same layer as a part of the structure of the peripheral area BB, and the structures are explained and introduced below. It needs to be noticed that in embodiments of the present disclosure, that multiple structures are located on the same layer refers to multiple structures may be formed by the same material layer through a patterning process in a preparation process, and thus the preparation process of the display substrate may be simplified.

Exemplarily, as shown in FIG. 3 to FIG. 5d, at least one kind of the power connection cables 09, the first power bus 08 and the data lines 03 may be located on the same layer as the connection electrodes 022. For example, the power connection cables 09 and the connection electrodes 022 are located on the same layer, in this way, when the connection electrodes 022 in the display area AA is prepared, the power connection cables 09 of the peripheral area BB may be prepared simultaneously, and processes for preparing the display substrate are simplified. Definitely, the power connection cables 09 and the connection electrodes 022 may also be not located on the same layer, and it is not defined in the embodiments of the present disclosure.

For example, as shown in FIG. 3 to FIG. 5d, the first power bus 08 and the connection electrodes 022 are located on the same layer, in this way, when the connection electrodes 022 in the display area AA are prepared, the first power bus 08 of the peripheral area BB may be prepared simultaneously, and the processes for preparing the display substrate are simplified. Definitely, the first power bus 08 and the connection electrodes 022 may also be not located on the same layer, and it is not defined in the embodiments of the present disclosure.

For example, as shown in FIG. 3 to FIG. 5d, the data lines 03 and the connection electrodes 022 are located on the same layer, in this way, when the connection electrodes 022 in the display area AA are prepared, the data lines 03 may be prepared simultaneously, and the processes for preparing the display substrate are simplified. Definitely, the data lines 03 and the connection electrodes 022 may also be not located on the same layer, and it is not defined in the embodiments of the present disclosure.

For example, as shown in FIG. 3 to FIG. 5d, the power connection cables 09, the first power bus 08 and the data lines 03 are located on the same layer as the connection electrodes 022. In this way, when the connection electrodes 022 in the display area AA are prepared, the power connection cables 09, the first power bus 08 and the data lines 03 of the peripheral area BB may be prepared simultaneously, and the processes for preparing the display substrate are simplified.

When the power connection cables 09 and the first power bus 08 are located on the same layer, if the first power bus 08 and the connection electrodes 022 are also located on the same layer, it means that the power connection cables 09 and the connection electrodes 022 are also located on the same layer. The selector switches 06 and the connection electrodes 022 are generally located on different layers, in this way, both the power connection cables 09 and the first power bus 08 are located on different layers as the selector switches 06, and therefore, the problem of short circuits among the power connection cables 09, the first power bus 08 and the selector switches 06 is further reduced.

Exemplarily, as shown in FIG. 3 to FIG. 6b, at least one kind of the power lines 04, the second power bus 010 and the third power bus 012 may be located on the same layer as the drive sources 0213 and the drive drains 0214. For example, the power lines 04 and the drive sources 0213 and the drive drains 0214 may be located on the same layer. In this way, when the drive sources 0213 and the drive drains 0214 in the display area AA are prepared, the power lines 04 may be prepared simultaneously, and the processes for preparing the display substrate are simplified.

For example, as shown in FIG. 3 to FIG. 6b, the second power bus 010 may be located on the same layer as the drive sources 0213 and the drive drains 0214. In this way, when the drive sources 0213 and the drive drains 0214 in the display area AA are prepared, the second power bus 010 of the peripheral area BB may be prepared simultaneously, and the processes for preparing the display substrate are simplified. Definitely, the second power bus 010 may also be not located on the same layer as the drive sources 0213 and the drive drains 0214, and it is not defined in the embodiments of the present disclosure.

For example, as shown in FIG. 3 to FIG. 6b, the third power bus 012 may be located on the same layer as the drive sources 0213 and the drive drains 0214. In this way, when the drive sources 0213 and the drive drains 0214 in the display area AA are prepared, the third power bus 012 of the peripheral area BB may be prepared simultaneously, and the processes for preparing the display substrate are simplified. Definitely, the third power bus 012 may also be not located on the same layer as the drive sources 0213 and the drive drains 0214, and it is not defined in the embodiments of the present disclosure.

For example, as shown in FIG. 3 to FIG. 5d, the data signal input lines 07 and the second capacitor electrodes 0342 may be located on the same layer. In this way, when the second capacitor electrodes 0342 in the display area AA is prepared, the data signal input lines 07 of the peripheral area BB may be prepared simultaneously, and the processes for preparing the display substrate are simplified. Definitely, the data signal input lines 07 and the second capacitor electrodes 0342 may also be not located on the same layer, for example, a part of the data signal input lines 07 and the drive gates may be located on the same layer, the other part of the data signal input lines 07 and the second capacitor electrodes are located on the same layer, and the two parts are staggered. It is not defined in the embodiments of the present disclosure.

Exemplarily, some structures of the thin film transistors in the selector switches 06 and some structures of the drive thin film transistors in the pixel drive circuits may also be located on the same layer. For example, the first active layers 061 and the drive active layers 0211 are located on the same layer, the first gates 062, the second gates 063 and the drive gates 0212 are located on the same layer, and the first sources 064, the first drains 065, the second drains 066 and the drive sources 0213 are located on the same layer. Definitely, the first active layers 061 and the drive active layers 0211 may also be not located on the same layer, the first gates 062 and the drive gates 0212 may also be not located on the same layer, the first sources 064 and the drive sources 0213 may also be not located on the same layer, and it is not defined in the embodiments of the present disclosure.

In specific application, in embodiments of the present disclosure, materials of the first flat layers 029 may be organic materials. Since the organic materials are prone to absorb water and oxygen, the water and oxygen may cause adverse influence upon other membrane layers. On such basis, in embodiments of the present disclosure, as shown in FIG. 6a and FIG. 6b, the first power bus 08 includes multiple openings KB which are arranged at intervals; and the orthographic projections of the openings KB on the substrate 01 partially overlap with the orthographic projections of the data signal input lines 07 on the substrate 01. In this way, the water and oxygen in the first flat layers 029 are released through the openings KB, thus improving the reliability of the display substrate.

Figure 7:
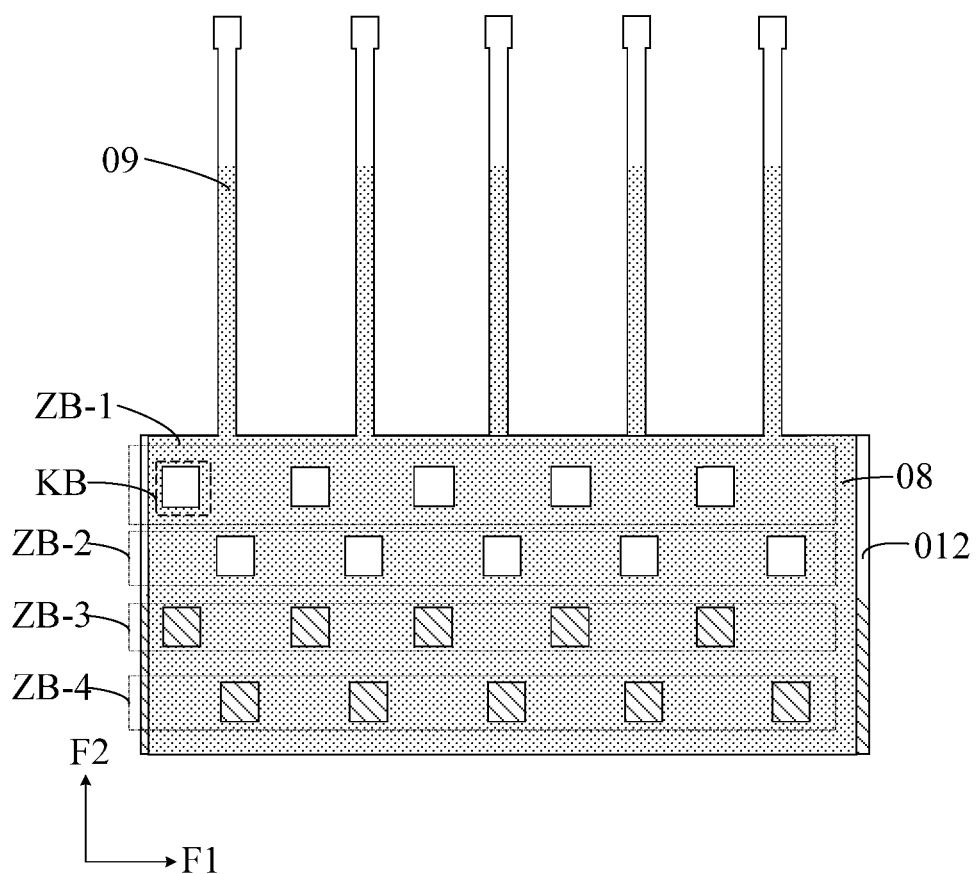
FIG. 7 is a structural schematic diagram of some more display substrates in embodiments of the present disclosure.
Figure 8:
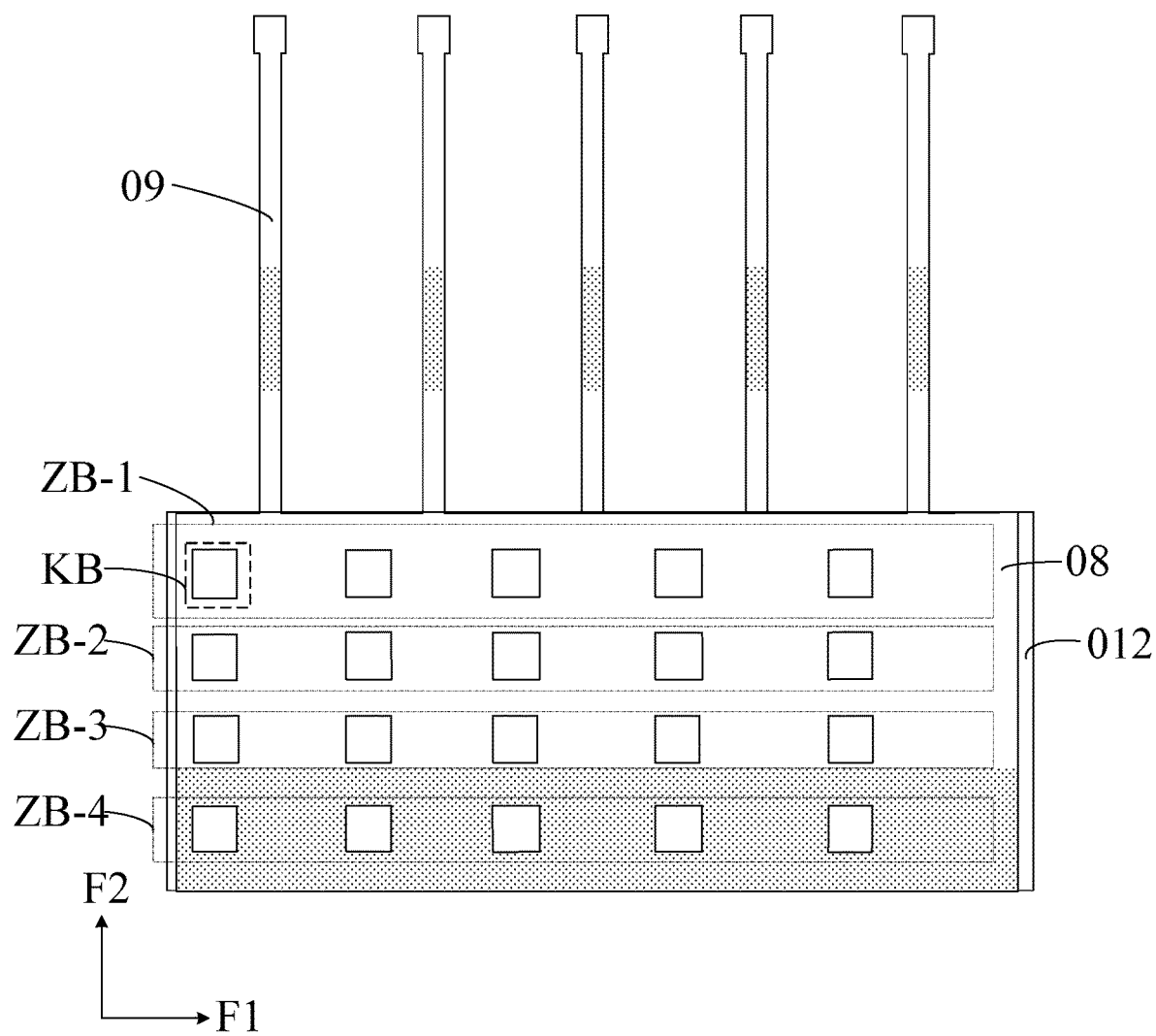
FIG. 8 is a structural schematic diagram of some more display substrates in embodiments of the present disclosure.

In specific application, in embodiments of the present disclosure, as shown in FIG. 7 and FIG. 8, multiple openings KB are divided into multiple opening groups ZB-k (k is greater than or equal to 1 and smaller than or equal to K, both k and K are integers, K is the total number of the opening groups, and FIG. 7 takes K=4 as an example) arranged along a second direction F2, and each opening group ZB-k includes multiple openings KB which are arranged along the first direction F1. In this way, by arranging multiple scattered openings KB, the water and oxygen in the first flat layers 029 may be further released, thus further improving the reliability of the display substrate.

In specific application, in embodiments of the present disclosure, the first direction F1 intersects with the second direction F2. For example, the first direction F1 is perpendicular to the second direction F2.

In specific application, in embodiments of the present disclosure, as shown in FIG. 7, openings in at least two adjacent opening groups are staggered. Exemplarily, openings in every two adjacent opening groups may be staggered. By taking four opening groups as an example, the display substrate has opening groups ZB-1, ZB-2, ZB-3 and ZB-4. Openings in the opening group ZB-1 and openings in the opening group ZB-2 are staggered, for example, the openings in the opening group ZB-2 correspond to gaps among adjacent openings in the opening group ZB-1. Openings in the opening group ZB-2 and openings in the opening group ZB-3 are staggered, for example, the openings in the opening group ZB-2 correspond to gaps among adjacent openings in the opening group ZB-3. Openings in the opening group ZB-3 and openings in the opening group ZB-4 are staggered, for example, the openings in the opening group ZB-2 correspond to gaps among adjacent openings in the opening group ZB-3.

In specific application, in embodiments of the present disclosure, as shown in FIG. 8, multiple openings may also be arrayed. In this way, the difficulty in designing the openings may be reduced.

In specific application, in embodiments of the present disclosure, as shown in FIG. 7 and FIG. 8, gaps between every two adjacent openings in each opening group may be roughly equal. Exemplarily, gaps between centers of every two adjacent openings in each opening group may be roughly equal.

It needs to be stated that in an actual process, because of limitation of process conditions or other factors, equality of the features is not completely equal but deviation is caused, then the equality relationship of the features may be achieved only if the conditions are roughly met, and these all belong to the protection scope of the present disclosure. For example, the equality may be one allowed within an error tolerance range.

Figure 9:
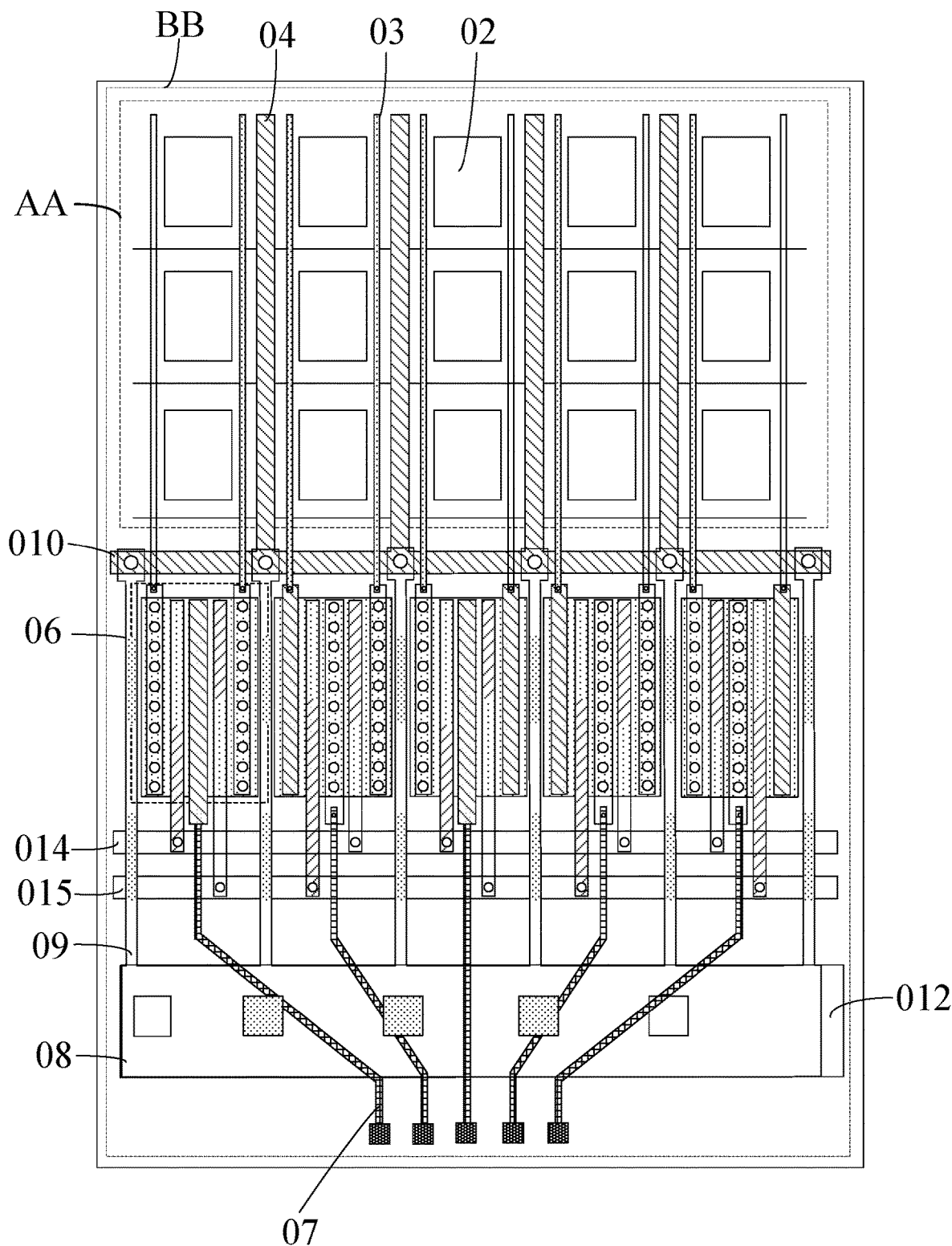
FIG. 9 is a structural schematic diagram of some more display substrates in embodiments of the present disclosure.

An embodiment of the present disclosure provides a structural schematic diagram of the display substrate, and as shown in FIG. 9, deformation is made for application modes of the embodiment. The differences between the embodiment and the above embodiments are stated only below, and the similarities are not repeated here.

In specific application, in embodiments of the present disclosure, the orthographic projections of the multiple power connection cables 09 on the substrate 01 are in the orthographic projections of the gaps among the multiple selector switches 06 on the substrate 01. In this way, the orthographic projections of the multiple power connection cables 09 on the substrate 01 do not overlap with the orthographic projections of the multiple selector switches 06 on the substrate 01. In this way, the overlapping degree of the power connection cables and the selector switches may be reduced, furthermore, parasitic capacitance formed by the power connection cables and the selector switches is reduced, and both the power connection cables and the selector switches are able to work normally.

Exemplarily, in embodiments of the present disclosure, as shown in FIG. 9, one power connection cable is arranged corresponding to one gap.

Figure 10:
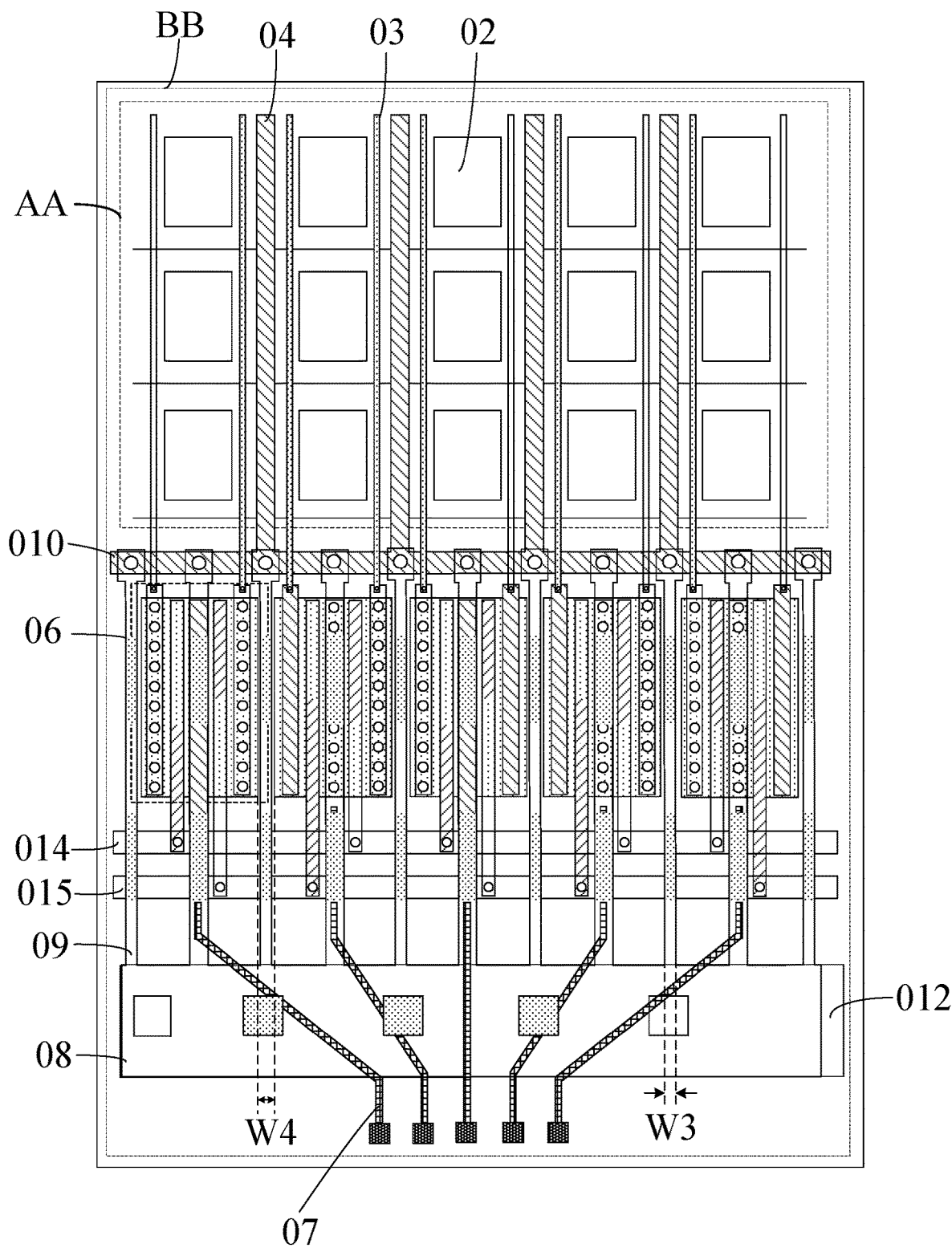
FIG. 10 is a structural schematic diagram of some more display substrates in embodiments of the present disclosure.

In specific application, in embodiments of the present disclosure, as shown in FIG. 10, aiming at the power connection cables and the gaps of which the orthographic projections overlap with each other, the power connection cables each have a third width W3 in the direction F1, the gaps each have a fourth width W4 in the direction F1, and the third width is smaller than the fourth width.

Further, in specific application, in embodiments of the present disclosure, as shown in FIG. 10, the orthographic projections of a part of the multiple power connection cables 09 on the substrate 01 cover the orthographic projections of the first sources 064 on the substrate 01. The orthographic projections of the other part of the multiple power connection cables 09 on the substrate 01 are located in the orthographic projections of the gaps among the selector switches 06 on the substrate 01.

For example, the display substrate may be a self-luminous display substrate such as an Organic Light Emitting Diode (OLED) or a Quantum Dot Light Emitting Diode (QLED) or a non-self-luminous display substrate such as a Liquid Crystal Diode (LCD), and the type of the display substrate is not defined in the embodiments of the present disclosure.

For example, when the display substrate is the OLED or the QLED, the display substrate may be packaged to form a display device.

For example, when the display substrate is an LCD display substrate, the display substrate further includes an alignment substrate, the display substrate and the alignment substrate are arranged in contrapositions, and a liquid crystal material is filled between the display substrate and the alignment substrate, so as to form the LCD display device. For example, the alignment substrate is a colored membrane substrate which includes structures such as a colored membrane layer for forming single-color light and a black matrix layer for light shielding. Structures of the display substrate are not specifically defined in the embodiments of the present disclosure.

The display substrate provided by the embodiments of the present disclosure may have irregular corners such as arc-shaped corners, and designing of the narrow frame may be also achieved, so that the high screen-to-body ratio is achieved, and a better display effect is achieved.

Figure 11A:
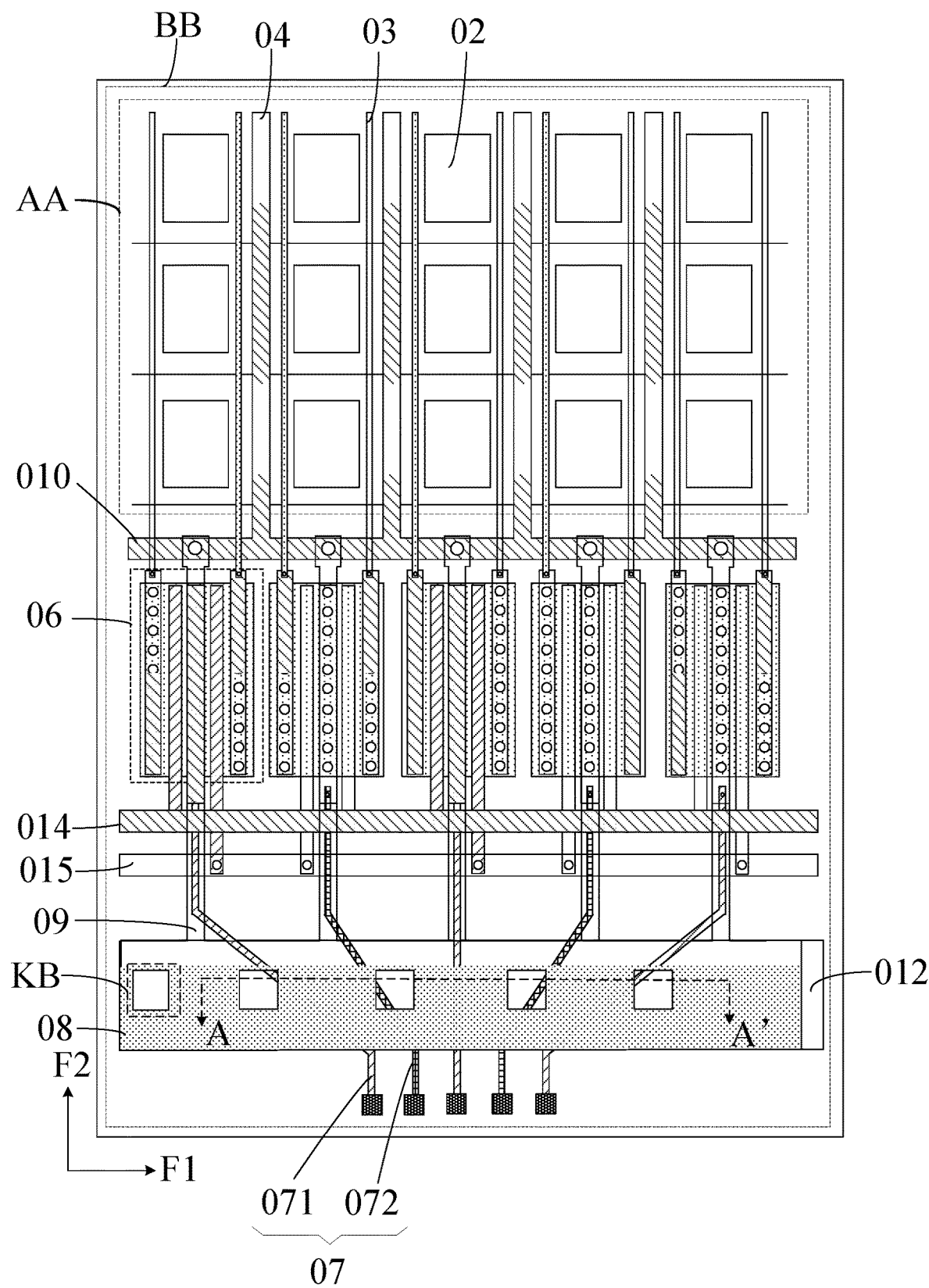
FIG. 11a is a structural schematic diagram of some more display substrates in embodiments of the present disclosure.
Figure 11B:
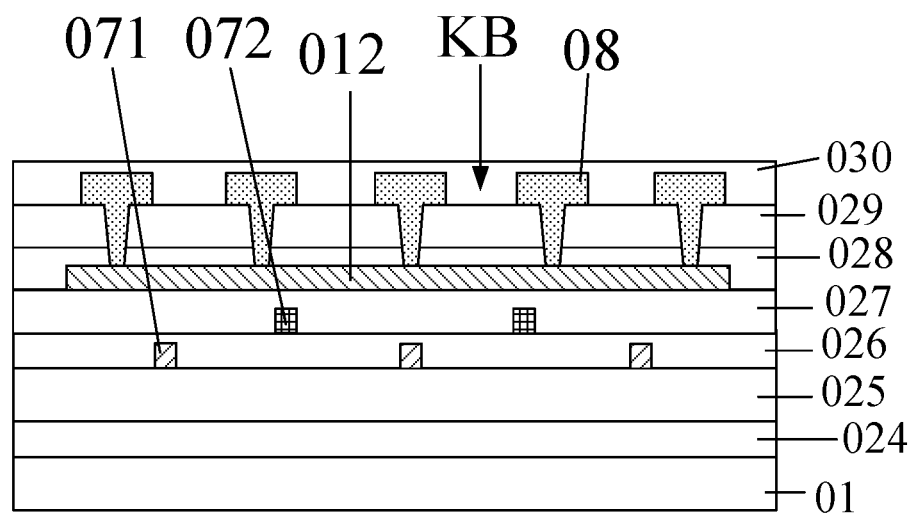
FIG. 11b is a structural schematic diagram of some more display substrates in embodiments of the present disclosure.

An embodiment of the present disclosure provides a structural schematic diagram of the display substrate, and as shown in FIG. 11a and FIG. 11b, deformation is made for application modes of the embodiments. The differences between the embodiment and the above embodiments are stated only below, and the similarities are not repeated here.

In specific application, in embodiments of the present disclosure, as shown in FIG. 11a and FIG. 11b, the multiple data signal input lines 07 may include first data signal input lines 071 and second data signal input lines 072; and the first data signal input lines 071 and the second data signal input lines 072 are staggered along the first direction F1. In this way, interference of arrangement on the same layer may be reduced.

In specific application, in embodiments of the present disclosure, as shown in FIG. 11a and FIG. 11b, the first data signal input lines 071 and the drive gates may be located on the same layer. In this way, the first data signal input lines 071 and the drive gates may be formed by the same patterning process.

In specific application, in embodiments of the present disclosure, as shown in FIG. 11a and FIG. 11b, the second data signal input lines 072 and the second capacitor electrodes may be located on the same layer. In this way, the second data signal input lines 072 and the second capacitor electrodes may be formed by the same patterning process.

At least one embodiment of the present disclosure further provides a display device, and the display device includes the display substrate. For example, the display device may be any product or component such as a mobile phone, a tablet PC, a television, a display, a notebook computer, a digital photo frame or a navigator with a display function, and the specific mode of the display device is not defined in the embodiments of the present disclosure.

Although preferred embodiments of the present disclosure have been described, those skilled in the art may make additional variations and modifications to these embodiments once basic creative concepts are known. Therefore, the attached claims are intended to be construed to include preferred embodiments and all variations and modifications falling within the scope of the present disclosure.

Obviously, those skilled in the art may make various modifications and variations of the embodiments of the present disclosure without departing from the spirit and scope of the embodiments of the present disclosure. Therefore, if such modifications and variations of embodiments of the present disclosure fall within the scope of the claims of the present disclosure and their equivalents, the present disclosure is also intended to include such modifications and variations.

What is claimed is:

1. A display substrate, comprising:
a substrate comprising a display area and a peripheral area arranged on at least one side of the display area;
multiple sub-pixels arranged in the display area;
multiple data lines arranged in the display area and electrically connected with the multiple sub-pixels, wherein the multiple data lines are configured to provide data signals for the multiple sub-pixels;
multiple power lines arranged in the display area and electrically connected with the multiple sub-pixels, wherein the multiple power lines are configured to provide power signals for the multiple sub-pixels;
multiple data signal input lines arranged in the peripheral area;
multiple selector switches arranged in the peripheral area and between the multiple data lines and the multiple data signal input lines, wherein at least one of the multiple selector switches is electrically connected with at least two of the multiple data lines and one of the multiple data signal input lines;
a first power bus arranged in the peripheral area and on a side, facing away from the display area, of the multiple selector switches; and
multiple power connection cables arranged in the peripheral area and between the first power bus and the multiple power lines;
wherein the multiple power connection cables are electrically connected with the first power bus and the multiple power lines;
wherein the multiple power connection cables correspond to the multiple selector switches one by one; and
an orthographic projection of each of the multiple power connection cables on the substrate at least partially overlaps with an orthographic projection of a corresponding selector switch on the substrate;
wherein each of the multiple selector switches comprises two thin film transistors;
the two thin film transistors comprise:
a first active layer arranged on the substrate;
a first gate and a second gate arranged on a side, facing away from the substrate, of the first active layer, wherein the first gate and the second gate are arranged on a same layer but do not overlap with each other;
a first source, a first drain and a second drain arranged on a side, facing away from the substrate, of the first gate and the second gate; wherein the first source, the first drain and the second drain are arranged on a same layer but do not overlap with one another; and the first source is arranged between the first drain and the second drain;
the first source is electrically connected with one of the multiple data signal input lines;
the first drain and the second drain are electrically connected with two of the multiple data lines;
the orthographic projection of the each of multiple power connection cables on the substrate covers an orthographic projection of the first source on the substrate; and
the orthographic projection of the each of multiple power connection cables on the substrate does not overlap with orthographic projections of the first gate and the second gate on the substrate.

2. The display substrate according to claim 1, wherein the at least one of the multiple selector switches comprises at least two thin film transistors;
the at least two thin film transistors comprise gates and at least one source and at least two drains arranged on a side, departing from the substrate, of the gates; and
an orthographic projection of each of the multiple power connection cables on the substrate at least partially overlaps with an orthographic projection of a source or a drain on the substrate.

3. The display substrate according to claim 2, wherein the orthographic projection of the each of the multiple power connection cables on the substrate does not overlap with orthographic projections of the gates on the substrate.

4. The display substrate according to claim 1, wherein the each of the power connection cables has a first width in an extension direction perpendicular to the multiple data lines;
the first source has a second width in the extension direction perpendicular to the multiple data lines; and
the first width is roughly the same as the second width.

5. The display substrate according to claim 1, wherein orthographic projections of the multiple power connection cables on the substrate are in orthographic projections of gaps among the multiple selector switches on the substrate.

6. The display substrate according to claim 5, wherein each of the power connection cables has a third width in an extension direction perpendicular to the multiple data lines;
each of the gaps has a fourth width in the extension direction perpendicular to the multiple data lines; and
the third width is smaller than the fourth width.

7. The display substrate according to claim 1, further comprising: a second power bus arranged between the multiple selector switches and the multiple power lines;
wherein the second power bus is electrically connected with the multiple power lines; and
the multiple power connection cables are electrically connected with the first power bus and the second power bus.

8. The display substrate according to claim 7, further comprising: a third power bus arranged in the peripheral area;
an orthographic projection of the third power bus on the substrate at least partially overlaps with an orthographic projection of the first power bus on the substrate; and
the third power bus is electrically connected with the first power bus.

9. The display substrate according to claim 1, wherein at least one of the multiple sub-pixels comprises a drive thin film transistor, a connection electrode and a storage capacitor;
wherein the drive thin film transistor comprises:
a drive active layer arranged on the substrate,
a drive gate arranged on a side, facing away from the substrate, of the drive active layer,
a gate insulator layer arranged on a side, facing away from the substrate, of the drive gate,
an interlayer dielectric layer arranged on a side, facing away from the substrate, of the gate insulator layer, and
a drive source and a drive drain arranged on a side, facing away from the substrate away, of the interlayer dielectric layer;
the connection electrode is arranged on a side, facing away from the substrate, of the drive source and the drive drain;
the storage capacitor comprises a first capacitor electrode and a second capacitor electrode;
the first capacitor electrode and the drive gate are arranged on a same layer;
the second capacitor electrode is arranged between the gate insulator layer and the interlayer dielectric layer; and
at least one kind of the a power connection cable, the first power bus and a data line is arranged on the same layer as the connection electrode.

10. The display substrate according to claim 9, wherein at least one kind of the a power line, a second power bus and a third power bus is arranged on a same layer as the drive source and the drive drain; and
a data signal input line and the second capacitor electrode are arranged on a same layer.

11. The display substrate according to claim 10, wherein the drive active layer and the first active layer are arranged on a same layer;
the first gate, the second gate and the drive gate are arranged on a same layer; and
the first source, the first drain and the second drain are arranged on a same layer as the drive source and the drive drain.

12. The display substrate according to claim 11, wherein an orthographic projection of the first power bus on the substrate at least partially overlaps with orthographic projections of the multiple data signal input lines on the substrate.

13. The display substrate according to claim 12, wherein the first power bus comprises multiple openings formed at intervals; and
orthographic projections of the multiple openings on the substrate at least partially overlap with the orthographic projections of the multiple data signal input lines on the substrate.

14. The display substrate according to claim 13, wherein the multiple openings are divided into multiple opening groups arranged along a second direction;

each of the multiple opening groups comprises multiple openings arranged along a first direction;

the first direction intersects with the second direction; and openings in at least two adjacent opening groups are staggered.

15. The display substrate according to claim 9, wherein the at least one of the multiple sub-pixels further comprises a light emitting diode arranged on a side, facing away from the substrate, of the connection electrode; and the drive drain, the connection electrode and the light emitting diode are electrically connected in sequence.

16. The display substrate according to claim 1, wherein the multiple data signal input lines comprise first data signal input lines and second data signal input lines;

the first data signal input lines and the second data signal input lines are alternatively arranged along a first direction;

the first data signal input lines and drive gates are arranged on a same layer; and the second data signal input lines and second capacitor electrodes are arranged on a same layer.

17. A display device comprising the display substrate according to claim 1.

* * * * *

UNITED STATES PATENT AND TRADEMARK OFFICE
CERTIFICATE OF CORRECTION

| | | |
|---|---|---|
| PATENT NO. | : 12,211,855 B2 | Page 1 of 1 |
| APPLICATION NO. | : 17/274861 | |
| DATED | : January 28, 2025 | |
| INVENTOR(S) | : Tinghua Shang et al. | |

It is certified that error appears in the above-identified patent and that said Letters Patent is hereby corrected as shown below:

On the Title Page

Item (73) Please delete the first Assignee's information in its entirety and substitute therefor
-- Chengdu BOE Optoelectronics Technology Co., Ltd., Chengdu, Sichuan Province (CN); --.

Signed and Sealed this
Eighteenth Day of March, 2025

Coke Morgan Stewart
*Acting Director of the United States Patent and Trademark Office*